United States Patent
Camp et al.

(10) Patent No.: US 10,372,519 B2
(45) Date of Patent: *Aug. 6, 2019

(54) DETECTING ERROR COUNT DEVIATIONS FOR NON-VOLATILE MEMORY BLOCKS FOR ADVANCED NON-VOLATILE MEMORY BLOCK MANAGEMENT

(71) Applicant: International Business Machines Corporation, Armonk, NY (US)

(72) Inventors: Charles J. Camp, Sugar Land, TX (US); Timothy J. Fisher, Cypress, TX (US); Aaron D. Fry, Richmond, TX (US); Nikolas Ioannou, Zurich (CH); Roman Pletka, Uster (CH); Sasa Tomic, Kilchberg (CH)

(73) Assignee: International Business Machines Corporation, Armonk, NY (US)

( * ) Notice: Subject to any disclaimer, the term of this patent is extended or adjusted under 35 U.S.C. 154(b) by 5 days.

This patent is subject to a terminal disclaimer.

(21) Appl. No.: 15/374,662

(22) Filed: Dec. 9, 2016

(65) Prior Publication Data

US 2017/0091006 A1    Mar. 30, 2017

Related U.S. Application Data

(63) Continuation of application No. 14/520,276, filed on Oct. 21, 2014, now Pat. No. 9,563,373.

(51) Int. Cl.
*G06F 11/07* (2006.01)
*G06F 3/06* (2006.01)
(Continued)

(52) U.S. Cl.
CPC .......... *G06F 11/076* (2013.01); *G06F 3/0619* (2013.01); *G06F 3/0647* (2013.01);
(Continued)

(58) Field of Classification Search
CPC .. G06F 11/076; G06F 11/1072; G06F 3/0619; G06F 3/0647; G06F 3/0653;
(Continued)

(56) References Cited

U.S. PATENT DOCUMENTS 5,490,110 A    2/1996   Sawada et al.
5,559,956 A    9/1996   Sukegawa
(Continued)

FOREIGN PATENT DOCUMENTS

CN    101325089 A    12/2008
EP     1008936 A2     6/2000
(Continued)

OTHER PUBLICATIONS

Editor: Valerie Illingworth for Market House Books, The Penguin Dictionary of Electronics, 1998, Penguin Group, Third Edition, pertinent pp. 100, 349, 350.*

(Continued)

*Primary Examiner* — April Y Blair
*Assistant Examiner* — Dipakkumar B Gandhi
(74) *Attorney, Agent, or Firm* — Zilka-Kotab, P.C.

(57) ABSTRACT

Non-volatile memory block management. A method according to one embodiment includes calculating an error count margin threshold for each of the at least some non-volatile memory blocks of a plurality of non-volatile memory blocks. A determination is made as to whether the error count margin threshold of any of the at least some of the non-volatile memory blocks has been exceeded. A memory block management function is triggered upon determining that the error count margin threshold of any of the at least some of the non-volatile memory blocks has been exceeded.

20 Claims, 7 Drawing Sheets

(51) Int. Cl.
   *G06F 11/10* (2006.01)
   *G11C 29/52* (2006.01)
   *G06F 11/18* (2006.01)

(52) U.S. Cl.
   CPC .......... *G06F 3/0653* (2013.01); *G06F 3/0688* (2013.01); *G06F 11/073* (2013.01); *G06F 11/0793* (2013.01); *G06F 11/1072* (2013.01); *G11C 29/52* (2013.01)

(58) Field of Classification Search
   CPC .. G06F 3/0688; G06F 11/073; G06F 11/0793; G11C 29/52
   See application file for complete search history.

(56) References Cited

U.S. PATENT DOCUMENTS

| | | | |
|---|---|---|---|
| 5,673,383 A | 9/1997 | Sukegawa | |
| 5,905,993 A | 5/1999 | Shinohara | |
| 6,259,627 B1 | 7/2001 | Wong | |
| 6,553,104 B1 | 4/2003 | Haefliger | |
| 6,996,692 B2 | 2/2006 | Kouno | |
| 7,424,666 B2 | 9/2008 | Chandwani et al. | |
| 7,542,344 B2 | 6/2009 | Kim | |
| 7,545,677 B2 | 6/2009 | Lee et al. | |
| 7,649,782 B2 | 1/2010 | Eguchi et al. | |
| 7,808,836 B2 | 10/2010 | Murin et al. | |
| 7,986,560 B2 | 7/2011 | Park et al. | |
| 8,116,141 B2 | 2/2012 | Yoo et al. | |
| 8,281,220 B2 | 10/2012 | Kitahara | |
| 8,296,620 B2 | 10/2012 | Chen et al. | |
| 8,356,216 B2 | 1/2013 | Radke et al. | |
| 8,447,919 B1 | 5/2013 | Agarwal et al. | |
| 8,463,983 B2 | 6/2013 | Eleftheriou et al. | |
| 8,527,819 B2 | 9/2013 | Shalvi et al. | |
| 8,555,109 B2 | 10/2013 | Dhuse et al. | |
| 8,601,313 B1 | 12/2013 | Horn | |
| 8,687,421 B2 | 4/2014 | Avila et al. | |
| 8,938,659 B2 | 1/2015 | Wu et al. | |
| 8,949,555 B1* | 2/2015 | Karamcheti | G06F 12/0253 711/158 |
| 9,075,705 B2 | 7/2015 | Hikichi | |
| 9,563,373 B2* | 2/2017 | Camp | G06F 3/0619 |
| 2004/0083335 A1 | 4/2004 | Gonzalez et al. | |
| 2005/0093571 A1 | 5/2005 | Suaris et al. | |
| 2005/0264910 A1 | 12/2005 | Lee | |
| 2006/0200299 A1* | 9/2006 | Torno | F02D 41/266 701/111 |
| 2007/0180328 A1 | 8/2007 | Cornwell et al. | |
| 2008/0123419 A1 | 5/2008 | Brandman et al. | |
| 2008/0192544 A1 | 8/2008 | Berman et al. | |
| 2008/0285351 A1* | 11/2008 | Shlick | G11C 11/5621 365/185.18 |
| 2009/0003073 A1 | 1/2009 | Rizel et al. | |
| 2009/0070654 A1 | 3/2009 | Flachs et al. | |
| 2009/0141563 A1 | 6/2009 | Furnemont | |
| 2009/0323412 A1 | 12/2009 | Mokhlesi et al. | |
| 2009/0323423 A1 | 12/2009 | Bloom et al. | |
| 2010/0046302 A1 | 2/2010 | Ogura et al. | |
| 2010/0064096 A1 | 3/2010 | Weingarten et al. | |
| 2010/0251075 A1* | 9/2010 | Takahashi | G06F 11/1068 714/773 |
| 2010/0257429 A1 | 10/2010 | Noguchi | |
| 2011/0041039 A1 | 2/2011 | Harari et al. | |
| 2011/0238890 A1 | 9/2011 | Sukegawa | |
| 2012/0047409 A1 | 2/2012 | Post et al. | |
| 2012/0066441 A1 | 3/2012 | Weingarten | |
| 2012/0198128 A1 | 8/2012 | Van Aken | |
| 2012/0216085 A1 | 8/2012 | Weingarten et al. | |
| 2012/0226963 A1 | 9/2012 | Bivens et al. | |
| 2012/0239858 A1 | 9/2012 | Melik-Martirosian | |
| 2012/0239991 A1 | 9/2012 | Melik-Martirosian | |
| 2012/0246540 A1 | 9/2012 | Lee et al. | |
| 2012/0250415 A1 | 10/2012 | Sharon et al. | |
| 2012/0278651 A1* | 11/2012 | Muralimanohar | G11C 29/76 714/6.11 |
| 2012/0284587 A1 | 11/2012 | Yu et al. | |
| 2012/0304039 A1 | 11/2012 | Peterson et al. | |
| 2012/0311271 A1 | 12/2012 | Klein et al. | |
| 2012/0324299 A1 | 12/2012 | Moshayedi | |
| 2012/0331207 A1 | 12/2012 | Lassa et al. | |
| 2013/0073786 A1 | 3/2013 | Belgal et al. | |
| 2013/0094286 A1 | 4/2013 | Sridharan et al. | |
| 2013/0111298 A1 | 5/2013 | Seroff et al. | |
| 2013/0124787 A1 | 5/2013 | Schuette | |
| 2013/0124931 A1 | 5/2013 | Chen | |
| 2013/0145079 A1 | 6/2013 | Lee et al. | |
| 2013/0166827 A1 | 6/2013 | Cideciyan et al. | |
| 2013/0194865 A1 | 8/2013 | Bandic et al. | |
| 2013/0215682 A1 | 8/2013 | Yang | |
| 2013/0227200 A1 | 8/2013 | Cometti et al. | |
| 2013/0294184 A1* | 11/2013 | Yang | H01L 25/0657 365/200 |
| 2013/0297988 A1 | 11/2013 | Wu et al. | |
| 2013/0339574 A1 | 12/2013 | Franceschini et al. | |
| 2014/0006694 A1 | 1/2014 | Seo et al. | |
| 2014/0029336 A1* | 1/2014 | Venkitachalam | G11C 16/0483 365/185.03 |
| 2014/0040664 A1* | 2/2014 | Hida | G06F 11/1068 714/15 |
| 2014/0040681 A1 | 2/2014 | Wolfman et al. | |
| 2014/0059405 A1 | 2/2014 | Syu et al. | |
| 2014/0082440 A1 | 3/2014 | Ho et al. | |
| 2014/0089564 A1 | 3/2014 | Liu et al. | |
| 2014/0095110 A1 | 4/2014 | Chen et al. | |
| 2014/0101490 A1 | 4/2014 | Cronin et al. | |
| 2014/0115238 A1 | 4/2014 | Xi et al. | |
| 2014/0126292 A1 | 5/2014 | Yang et al. | |
| 2014/0204672 A1 | 7/2014 | Lee et al. | |
| 2014/0208004 A1 | 7/2014 | Cohen et al. | |
| 2014/0208041 A1 | 7/2014 | Hyde et al. | |
| 2014/0226398 A1 | 8/2014 | Desireddi et al. | |
| 2014/0334228 A1 | 11/2014 | Kim et al. | |
| 2015/0103593 A1 | 4/2015 | Su | |
| 2015/0154061 A1 | 6/2015 | Camp et al. | |
| 2015/0161034 A1 | 6/2015 | Fisher | |
| 2015/0161035 A1 | 6/2015 | Fisher et al. | |
| 2015/0161036 A1 | 6/2015 | Camp et al. | |
| 2015/0169468 A1 | 6/2015 | Camp et al. | |
| 2015/0170746 A1 | 6/2015 | Oowada et al. | |
| 2015/0177995 A1 | 6/2015 | Camp et al. | |
| 2015/0243363 A1 | 8/2015 | Wu et al. | |
| 2015/0262712 A1 | 9/2015 | Chen et al. | |
| 2016/0110124 A1 | 4/2016 | Camp et al. | |
| 2016/0110248 A1 | 4/2016 | Camp et al. | |
| 2016/0179412 A1 | 6/2016 | Camp et al. | |
| 2016/0179664 A1 | 6/2016 | Camp et al. | |

FOREIGN PATENT DOCUMENTS

| | | |
|---|---|---|
| JP | H05282880 A | 10/1993 |
| JP | 5203049 B2 | 6/2013 |
| KR | 20130088061 A | 8/2013 |
| WO | 2009072100 A2 | 6/2009 |
| WO | 2009114618 A2 | 9/2009 |

OTHER PUBLICATIONS

List of IBM Patents or Patent Applications Treated as Related.
Supplemental Notice of Allowance from U.S. Appl. No. 14/520,276, dated Dec. 15, 2016.
Camp et al., U.S. Appl. No. 14/500,900, filed Oct. 21, 2014.
Notice of Allowance from U.S. Appl. No. 14/500,900, dated Sep. 22, 2015.
Camp et al., U.S. Appl. No. 14/581,963, filed Dec. 23, 2014.
Camp et al., U.S. Appl. No. 14/520,276, filed Oct. 21, 2014.
Camp et al., U.S. Appl. No. 14/581,976, filed Dec. 23, 2014.
Camp et al., U.S. Appl. No. 14/139,925, filed Dec. 24, 2013.
Non-Final Office Action from U.S. Appl. No. 14/139,925, dated Jul. 8, 2015.

(56) References Cited

OTHER PUBLICATIONS

International Search Report and Written Opinion from PCT Application No. PCT/JP2014/005371, dated Dec. 16, 2014.
Camp et al., U.S. Appl. No. 14/520,034, filed Oct. 21, 2014.
Camp et al., U.S. Appl. No. 14/568,178, filed Dec. 12, 2014.
Anonymous, "Method of combined data retention and wear leveling scan for minimizing flash resource contention in flash based memory systems," IP.com Electronic Publication, Aug. 10, 2013, pp. 1-3.
Cai et al., "Threshold Voltage Distribution in MLC NAND Flash Memory: Characterization, Analysis, and Modeling," European Design and Automation Association, Mar. 2013, pp. 1-6.
Chang et al., "Endurance Enhancement of Flash-Memory Storage Systems: An Efcient Static Wear Leveling Design," 44th ACM/IEEE Design Automation Conference, Jun. 4-8, 2007, pp. 212-217.
Chang et al., "A Low-Cost Wear-Leveling Algorithm for Block-Mapping Solid-State Disks," ACM SIGPLAN/SIGBED Conference on Languages, Compilers, Tools and Theory for Embedded Systems, Apr. 11-14, 2011, pp. 31-40.
Chang, Li-Pin, "On Efficient Wear Leveling for Large-Scale Flash-Memory Storage Systems," Proceedings of the 2007 ACM symposium on Applied computing, Mar. 11-15, 2007, 5 pages.
Chen et al., "Bias-induced oxygen adsorption in zinc tin oxide thin film transistors under dynamic stress," Applied Physics Letters 96, No. 26, Jun. 2010, pp. 262104-1-262104-3.
Cho et al., "NAND Reliability Improvement with Controller Assisted Algorithms in SSD," Flash Memory Summit, Santa Clara, CA, Aug. 2013, pp 1-18.
Choi et al., "Wear Leveling for PCM Using Hot Data Identification." Proceedings of the International Conference on IT Convergence and Security 2011, Dec. 7, 2011, 2 pages.
Dong et al., "Using Lifetime-Aware Progressive Programming to Improve SLC NAND Flash Memory Write Endurance," IEEE, Jul. 3, 2013, pp. 1270-1280.
Frickey, R., "Data Integrity on 20nm SSDs," Flash Memory Summit, Aug. 2012, pp. 1-24.
Gregori et al., "On-Chip Error Correcting Techniques for New-Generation Flash Memories," Proceedings of the IEEE, vol. 91, Issue 4, Apr. 2003, pp. 602-616.
Grupp et al., "Characterizing Flash Memory: Anomalies, Observations, and Applications," IEEE/ACM International Symposium on Microarchitecture, Dec. 12-16, 2009, 10 pages.
Hsieh et al., "Efficient Identification of Hot Data for Flash Memory Storage Systems," ACM Transactions on Storage, vol. 2, No. 1, Feb. 2006, pp. 22-40.
Hu et al., "Container Marking: Combining Data Placement, Garbage Collection and Wear Levelling for Flash," IEEE, Jul. 25-27, 2011, pp. 237-247.
Huang et al., "An Aggressive Worn-out Flash Block Management Scheme to Alleviate SSD Performance Degradation," Eurosys'14, Apr. 14-16, 2014, 14 pages.
Hutsell et al., "Flash Solid-State Disk Reliability," Texas Memory Systems, Nov. 2008, pp. 1-16.
Hutsell, W., "An In-depth Look at the RamSan-500 Cached Flash Solid State Disk," Texas Memory Systems, Mar. 2008, pp. 1-14.
Hutsell, W., "An In-depth Look at the RamSan-620 Flash Solid State Disk," Texas Memory Systems, Jul. 2009, pp. 1-16.
Jung et al., "A Group-Based Wear-Leveling Algorithm for Large-Capacity Flash Memory Storage Systems," Proceedings of the 2007 International Conference on Compilers, architecture, and synthesis for embedded systems, Sep. 30-Oct. 3, 2007, pp. 160-164.
Micheloni et al., "Non-volatile memories for removable media," Proceedings of the IEEE, vol. 97, No. 1, Jan. 2009, pp. 148-160.
Prince, B., "After DRAM—Some Novel Contenders," Emerging Memories: Technologies and Trends, Feb. 28, 2002, pp. 181-233.
Qureshi et al., "Enhancing Lifetime and Security of PCM-Based Main Memory with Start-Gap Wear Leveling," 42nd Annual IEEE/ACM International Symposium on Microarchitecture, Dec. 12-16, 2009, pp. 14-23.
Schmidt et al., "Heavy Ion SEE Studies on 4-Gbit NAND-Flash Memories," IEEE, Sep. 10-14, 2007, pp. 1-4.
Silverton Consulting, Inc., "IBM FlashSystem 840 RAS for better performance and data protection," StorInt Briefling, Jun. 2012, pp. 1-7.
Non-Final Office Action from U.S. Appl. No. 14/520,276, dated Mar. 29, 2016.
Non-Final Office Action from U.S. Appl. No. 14/139,925, dated Jan. 4, 2016.
Non-Final Office Action from U.S. Appl. No. 14/581,976, dated Apr. 11, 2016.
Non-Final Office Action from U.S. Appl. No. 14/520,034, dated May 6, 2016.
Final Office Action from U.S. Appl. No. 14/139,925, dated May 20, 2016.
Wong et al., "Phase Change Memory," Proceedings of the IEEE, vol. 98, No. 12, Nov. 2012, pp. 2201-2227.
Ricco et al., "Nonvolatile Multilevel Memories for Digital Applications," Proceedings of the IEEE, vol. 86, No. 12, Dec. 1998, pp. 2399-2423.
Chien et al., "A Multi-Level 40nm WOx Resistive Memory with Excellent Reliability," Electron Devices Meeting (IEDM) 2011 IEEE International, Dec. 5-7, 2011, pp. 31.5.1-31.5.4.
Non-Final Office Action from U.S. Appl. No. 14/581,963, dated Sep. 13, 2016.
Notice of Allowance from U.S. Appl. No. 14/568,178, dated Sep. 12, 2016.
Jimenez et al., "Wear Unleveling: Improving NAND Flash Lifetime by Balancing Page Endurance," 12th USENIX Conference on File and Storage Technologies, Feb. 17-20, 2014, pp. 47-59.
Notice of Allowance from U.S. Appl. No. 14/520,276, dated Sep. 15, 2016.
Notice of Allowance from U.S. Appl. No. 14/139,925, dated Sep. 16, 2016.
Supplemental Notice of Allowance from U.S. Appl. No. 14/520,276, dated Oct. 20, 2016.
Non-Final Office Action from U.S. Appl. No. 14/520,034, dated Oct. 27, 2016.
Camp et al., U.S. Appl. No. 16/417,453, filed May 20, 2019.

* cited by examiner

DETECTING ERROR COUNT DEVIATIONS FOR NON-VOLATILE MEMORY BLOCKS FOR ADVANCED NON-VOLATILE MEMORY BLOCK MANAGEMENT

BACKGROUND

The present invention relates to non-volatile memory such as NAND Flash memory, and more particularly, this invention relates to advanced management of non-volatile memory blocks.

Using Flash memory as an example, the residual bit error rate (RBER) of a Flash memory block will typically increase over time due to additional program and erase cycling, retention, charge leakage from retention, and additional charge placed in the cells by read operations (i.e., read disturb errors). Typically, a Flash memory block is retired when any page in the block exhibits a code word that reaches a page retirement error count limit. This limit is typically set to be achieved in conjunction with an appropriate error correction code (ECC), with the RBER for a Flash memory block being set to be similar to the RBER in traditional hard disk drives, e.g., at around $10 \times 10^{-15}$, but may be more or less.

Threshold voltage shifting, also known as block calibration, has been shown to be a key contributor to enhance endurance and retention for enterprise-level Flash memory systems using 19 nm and sub-19 nm NAND Flash memory. Preferably, the optimal threshold voltage shift values are determined shortly after a Flash memory block has been written. Unfortunately, this is not possible under a sustained heavy write workload without impacting data path performance. After initial writing, the threshold voltage shift values should be updated periodically as long as data remains on the Flash memory blocks. However, this would require significant additional read workload and data processing for every Flash memory block written, which is not acceptable in a Flash memory system.

Therefore, block calibrations are preferably executed at low frequency in the background and not in the data path, e.g., due to additional read operations and data processing which would otherwise be required. However, prior attempts to achieve such functionality have been unsuccessful because background calibration of a block may not always be executed at any time, e.g., when a block is not yet programmed after an erase operation.

SUMMARY

A system according to one embodiment includes a plurality of non-volatile memory blocks configured to store data. The system also includes a controller and logic integrated with and/or executable by the controller. The logic is configured to: calculate an error count margin threshold for each of at least some of the non-volatile memory block, determine whether the error count margin threshold of any of the at least some of the non-volatile memory blocks has been exceeded, and trigger a memory block management function upon determining that the error count margin threshold of any of the at least some of the non-volatile memory blocks has been exceeded.

A method according to one embodiment includes calculating an error count margin threshold for each of the at least some non-volatile memory blocks of a plurality of non-volatile memory blocks. A determination is made as to whether the error count margin threshold of any of the at least some of the non-volatile memory blocks has been exceeded. A memory block management function is triggered upon determining that the error count margin threshold of any of the at least some of the non-volatile memory blocks has been exceeded.

A computer program product according to one embodiment includes a computer readable storage medium having program instructions embodied therewith. The program instructions are readable and/or executable by a controller to cause the controller to perform the foregoing method.

Other aspects and embodiments of the present invention will become apparent from the following detailed description, which, when taken in conjunction with the drawings, illustrate by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified. Furthermore, as used herein, the term "about" with reference to some stated value refers to the stated value±10% of said value.

The following description discloses several preferred embodiments of non-volatile memory data storage systems, as well as operation and/or component parts thereof, capable of detecting error count deviations upon reads. Various embodiments described and/or suggested herein are able to track the health of each memory block in a system, as will be described in further detail below.

It should be appreciated that various embodiments herein can be implemented with a wide range of memory mediums, including for example non-volatile random access memory (NVRAM) technologies such as NAND flash memory, NOR flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In one general embodiment, a system includes a plurality of non-volatile memory blocks configured to store data. The system also includes a controller and logic integrated with and/or executable by the controller. The logic is configured to, for at least some of the plurality of non-volatile memory blocks: determine a block health of each non-volatile memory block, calculate an error count margin threshold for each non-volatile memory block, determine whether the error count margin threshold of any of the non-volatile memory blocks has been exceeded, and trigger a memory block management function upon determining that the error count margin threshold of any of the non-volatile memory blocks has been exceeded.

In another general embodiment, a method includes determining a block health of at least some non-volatile memory blocks of a plurality of non-volatile memory blocks that are configured to store data. An error count margin threshold is calculated for each of the at least some non-volatile memory blocks. A determination is made as to whether the error count margin threshold of any of the at least some non-volatile memory blocks has been exceeded. A memory block management function is triggered upon determining that the error count margin threshold of any of the non-volatile memory blocks has been exceeded.

In yet another general embodiment, a computer program product includes a computer readable storage medium having program instructions embodied therewith. The program instructions are readable and/or executable by a controller to cause the controller to perform the foregoing method.

Figure 1:
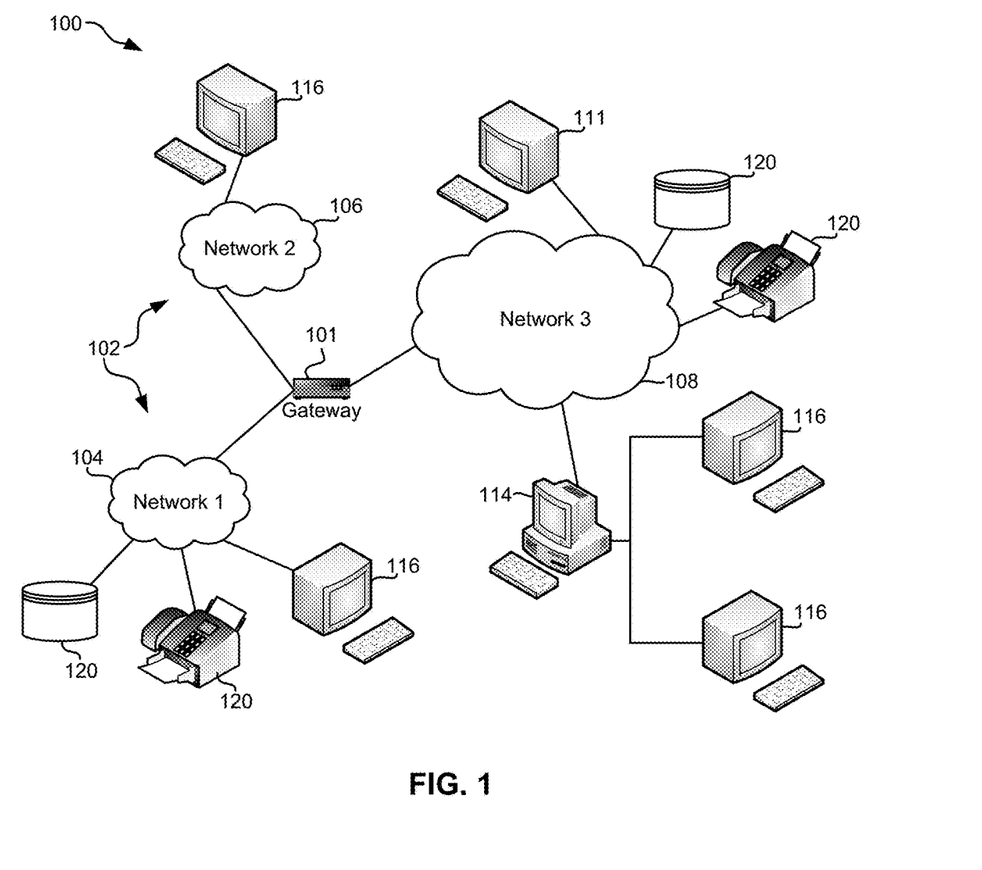
FIG. 1 illustrates a network architecture, in accordance with one embodiment.

FIG. 1 illustrates a network architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present network architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. Such user devices 116 may include a desktop computer, laptop computer, handheld computer, printer, and/or any other type of logic-containing device. It should be noted that a user device 111 may also be directly coupled to any of the networks, in some embodiments.

A peripheral 120 or series of peripherals 120, e.g., facsimile machines, printers, scanners, hard disk drives, networked and/or local data storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some embodiments, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In other embodiments, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 2:
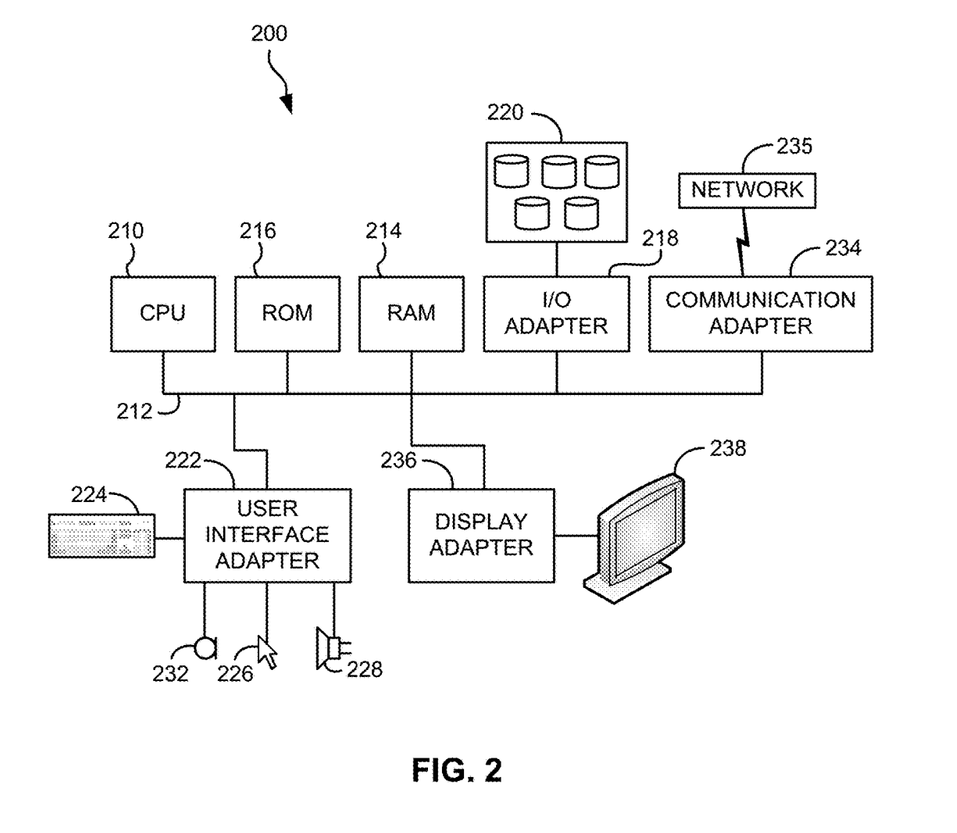
FIG. 2 shows a representative hardware environment of a processor system that may be associated with the servers and/or clients of FIG. 1, in accordance with one embodiment.

FIG. 2 shows a representative hardware environment associated with a user device 116 and/or server 114 of FIG. 1, in accordance with one embodiment. FIG. 2 illustrates a typical hardware configuration of a processor system 200 having a central processing unit 210, such as a microprocessor, and a number of other units interconnected via a system bus 212, according to one embodiment.

The processor system 200 shown in FIG. 2 includes a Random Access Memory (RAM) 214, Read Only Memory (ROM) 216, an I/O adapter 218 for connecting peripheral devices such as storage subsystem 220 to the bus 212, a user interface adapter 222 for connecting a keyboard 224, a mouse 226, a speaker 228, a microphone 232, and/or other user interface devices such as a touch screen, a digital camera (not shown), etc., to the bus 212, communication adapter 234 for connecting the processor system 200 to a communication network 235 (e.g., a data processing network) and a display adapter 236 for connecting the bus 212 to a display device 238.

The processor system 200 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 3:
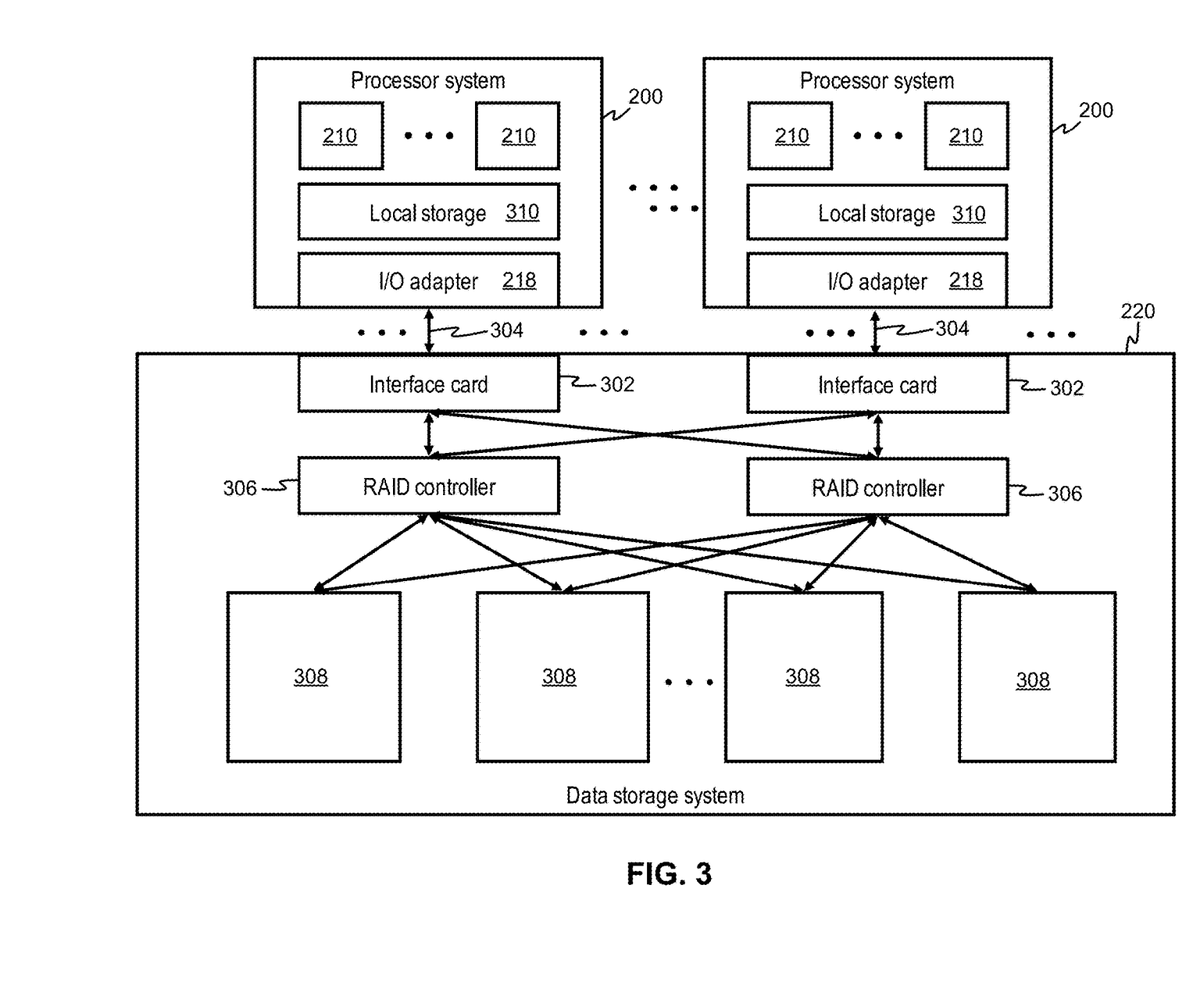
FIG. 3 shows a data storage system architecture, in accordance with one embodiment.

Now referring to FIG. 3, a data storage system 220 architecture is shown according to an exemplary embodiment which is in no way intended to limit the invention. Moreover, it should be noted that FIG. 3 includes components of the embodiment of FIG. 2. It follows that various components of FIG. 3 has common numbering with those of FIG. 2.

The data storage system 220 comprises a number of interface cards 302 configured to communicate via I/O interconnections 304 to one or more processor systems 200. The data storage system 220 may also comprise one or more RAID controllers 306 configured to control data storage in a plurality of non-volatile memory data storage cards or solid state disks (SSD) 308. The non-volatile memory data storage cards 308 may comprise solid state disks (SSD), Flash memory cards, RAM, ROM, and/or some other known type of non-volatile memory.

The I/O interconnections 304 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 306 in the data storage system 220 may perform a parity scheme similar to that employed by RAID-5, RAID-10, or some other suitable parity scheme, as would be understood by one of skill in the art upon reading the present descriptions.

Each processor system 200 comprises one or more processors 210 (such as CPUs, microprocessors, etc.), local data storage 310 (such as RAM 214, ROM 216, etc.), and an I/O adapter 218 configured to communicate with the data storage system 220.

Figure 4:
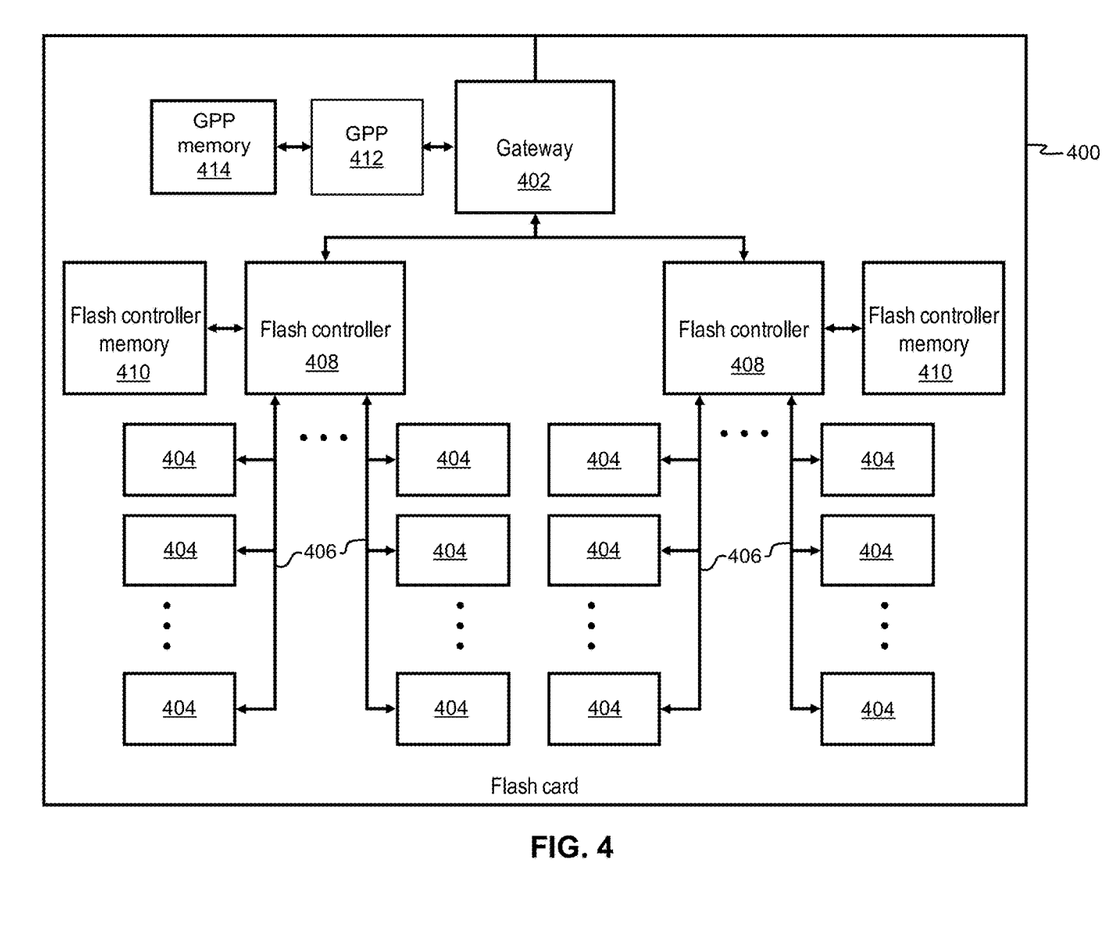
FIG. 4 shows a Flash memory card, in accordance with one embodiment.

In FIG. 4, a Flash card 400 is shown as an exemplary non-volatile data storage card according to one embodiment. Although other types of non-volatile data storage cards may be used in a data storage system, the Flash card 400 is shown as a non-limiting example. Each Flash card 400 comprises a gateway 402, a general purpose processor (GPP) 412 (such as an ASIC, FPGA, CPU, etc.) connected to a GPP memory 414 (which may comprise RAM, ROM, battery-backed DRAM, phase-change memory PC-RAM, MRAM, STT-MRAM, etc., or a combination thereof), and a number of Flash controllers 408. Each Flash controller 408 is connected to a plurality of Flash memory modules 404 (which may comprise NAND Flash or some other suitable Flash type known in the art) via channels 406. Each Flash controller 408 is also connected to a Flash controller memory 410 (which may be battery-backed DRAM, phase-change memory PC-RAM, MRAM, STT-MRAM, etc., or a combination thereof).

Flash controllers 408 and/or other controllers described herein (e.g., RAID controllers 306 of FIG. 3) may be able to perform various functions on stored data, depending on the desired embodiment. Specifically, Flash controllers 408 and/or other controllers described herein may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of Flash SSD controllers of the present description is intended to refer to the process of identifying blocks of data to be reclaimed for future usage and relocating all pages that are still valid therein. Moreover, depending on the specific controller and/or the respective garbage collection unit of operation, block-stripes may be identified for being reclaimed and/or relocated.

As alluded to above, the unit of the garbage collection operation is referred to herein as the Logical Erase Block (LEB). It should also be noted that an LEB may be any multiple of the physical flash block, which is a unit of physical erasure. Moreover, the organization of flash blocks into LEBs allows for adding RAID-like parity protection schemes among flash blocks from different flash chips, flash planes and/or channels as well as significantly enhancing performance through higher parallelism.

According to an exemplary embodiment, which is in no way intended to limit the invention, the Flash controllers 408 may internally perform a parity scheme (similar to some RAID implementation such as RAID-5, RAID-10, etc.) to protect against chip/plane failures. In this parity scheme, erased Flash blocks from different channels are grouped together into a block stripe. The block stripe may then build a garbage collection unit which performs garbage collection by selecting a block stripe according to a certain predetermined strategy and relocating all still valid data. Once all still valid data has been relocated, all blocks in the block stripe designated as garbage may be erased and put back into a pool of erased blocks from which new block stripes may be built later.

Heat Segregation

In the present context, the "heat" of a logical page refers to the rate (e.g., frequency) at which the logical page is written to (e.g., updated with new data). Pages that are considered as "hot" tend to have a frequent updated rate, while pages that are considered "cold" pages have an update rate slower than hot pages.

It should be noted that the number of read requests to and/or read operations performed on a logical page may not come into play when determining the heat of the logical page for some embodiments. For example, if data is frequently read from a particular logical page, that high read frequency does not mean that logical page will also have a high update rate. Rather, a high frequency of read operations performed on a given logical page may denote an importance, value, etc. of the data stored in the logical page.

By grouping logical pages of the same and/or similar heat values, heat segregation may be achieved. In particular, heat segregating methods may group hot logical pages together in certain flash blocks while cold logical pages are grouped together in separate flash blocks. Thus, a heat segregated LEB tends to be occupied by either hot or cold data.

The merit of heat segregation is two-fold. First, performing a garbage collection process on a hot block will prevent from triggering the relocation of cold data as well. In the absence of heat segregation, updates to hot data, which are performed frequently, also results in the undesirable relocations of all cold data collocated on the same LEB as the hot data is being relocated. Secondly, the relative heat of data can be utilized for wear-leveling purposes. For example, hot data may be placed in younger (e.g., healthier) blocks, while cold data may be placed on older (e.g., less healthy) blocks relative to those younger blocks. Thus, the rate at which relatively older blocks are exposed to wear is effectively slowed, thereby improving the lifetime of a given data storage system implementing heat segregation.

Write Allocation

Write allocation consists of placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, GC may take place concurrently with user write operations. For example, as a user (e.g., a host) writes data to a device, the device controller may continuously perform GC on LEBs with invalid data to make space for the new incoming data pages. As mentioned above, the LEBs having the GC being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Error count rates for Flash memory blocks increase with time and use. As Flash memory blocks are used, each program/erase (P/E) cycle performed on the blocks causes irreversible damage. In turn, this damage increases the error count rate for such Flash memory blocks. Moreover, although increases in error count rates due to retention and/or read disturbances are not permanent in the sense that the Flash memory blocks affected are not being irreversibly damaged, these unfavorable declines in performance are only remedied when the Flash memory blocks are erased ore re-calibrated. Thus, block calibration, also known as threshold voltage shifting, is an important aspect of enhancing endurance and retention for flash systems, e.g., particularly enterprise-level flash systems.

Optimal thresholds voltage shift values are preferably determined shortly after a flash block has been written and periodically afterwards. The threshold voltage can be considered an index of the memory state, as determined by measuring the source-drain current when a control gate bias is applied to the memory cell. Typically, upon a read operation, a read voltage between adjacent nominal threshold voltages is used to determine the memory cell state. As the threshold voltage value of the memory cell changes as explained above, the read voltage that need to be applied on a read operation is preferably shifted using a read threshold voltage shift value, also denoted as a threshold voltage shift value, to obtain optimal readout conditions. Subsequently, the optimal thresholds voltage shift values may be updated periodically, e.g., in a background health check. Updating the optimal thresholds voltage shift values as data stays on the blocks is desirable because retention and read disturb errors cause a shift in the optimal threshold voltages.

Block calibrations are preferably executed in the background at a low rate and not in the data path, e.g., due to additional read operations and data processing which would otherwise be required. Although conventional products are able to execute block calibrations in the background, they are plagued by reoccurring instances in which blocks requiring calibration are skipped over during background health check iterations resulting in unnecessary latency spikes due to uncorrectable errors requiring higher level data reconstruction or in-data-path re-calibrations.

This is generally a result of conventional background health checks operating on valid block stripes. In other words, only blocks which are holding data are tested and/or calibrated. It follows that blocks requiring calibration are potentially skipped over during several instances of background health check iterations. To name a few, blocks requiring calibration in conventional products may be skipped over when: the block does not belong to a valid block stripe, the block has been removed from a block stripe due to the block stripe being relocated, erased, and added to the ready-to-use (RTU) list, etc. Furthermore, in some instances a block requiring calibration is skipped over when it is taken from an RTU list to build a new block stripe that the background health checker already checked during the current iteration (holding different blocks) but had been dissolved in the meantime. In other words, when a block stripe is under garbage collection and being rebuilt with new blocks after the block stripe had been checked, or when the block stripe was invalid when it was checked and built with new blocks later, one or more blocks requiring calibration are skipped over in conventional products and processes. In the worst case, these conditions may happen repeatedly on the same block over many background health checks.

To address this conventional issue, methods to detect error count deviations upon reads are presented in the present disclosure. Various embodiments described and/or suggested herein are able to track the health of each Flash memory block in a system, as will be described in further detail below.

Figure 5:
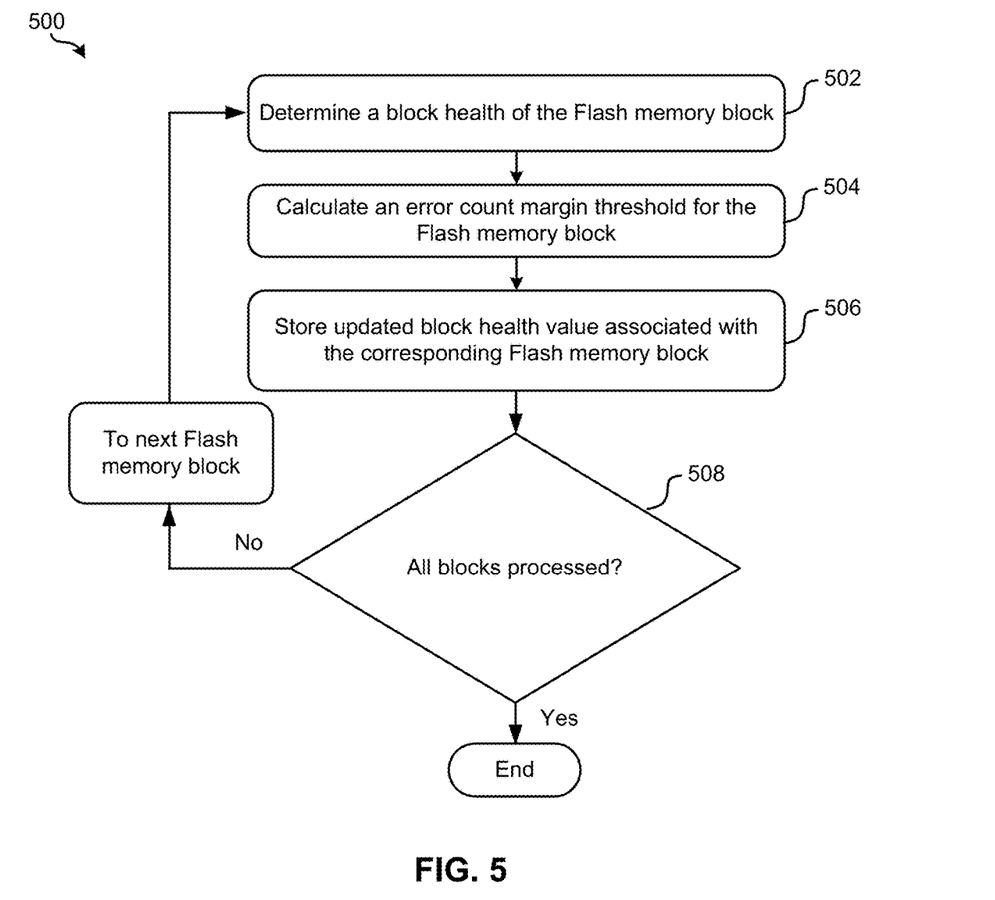
FIG. 5 is a flowchart of a method, in accordance with one embodiment.

Now referring to FIG. 5, a flowchart of a method 500 is shown according to one embodiment. It is preferred that one or more of the operations in method 500 are performed for at least some of a plurality of Flash memory blocks, preferably all blocks which are configured to store data. However, the method 500 may be performed in accordance with the present invention in any of the environments depicted in FIGS. 1-4, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by a controller, e.g., such as RAID controller 306 of FIG. 3 and/or Flash controller 408 of FIG. 4, or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 5, method 500 is performed individually for each block selected for processing. As described above, it is preferred that one or more of the operations in method 500 are performed for at least some of a plurality of Flash memory blocks (e.g., of modules 404 of FIG. 4) which are configured to store data.

Operations 502, 504, and 506 are executed block-by-block for at least some of the Flash memory blocks in the given array thereof. In operation 502, a block health of the Flash memory block is determined. Thus, operation 502 preferably includes determining a block health of a Flash memory block.

The health of a block (also referred to herein as a "block health") may correspond to one or more health metrics such as the number of errors of the worst ECC codeword in the block, the program/erase cycle count, read/program/erase latencies and/or other health-related factors. The background health check is preferably performed by a background health checker which may perform health check functions, e.g., such as read scrubbing, to determine if data is still readable. Moreover, the block health is preferably determined in the background health check process from page read operations with the optimal threshold voltage shift values. It should be noted that in some embodiments, the block health of each Flash memory block is not reset upon block erase operations. Rather, a block health may be updated when the corresponding Flash memory block is examined by a background health checker.

According to an exemplary embodiment, which is in no way intended to limit the invention, the block health of each Flash memory block may be stored with the block statistics in GPP memory 414. Moreover, the block health of a given Flash memory block may be updated when a background health check is examining that particular Flash memory block.

The health of Flash memory blocks may be determined periodically, e.g., upon receiving a request, upon experiencing a predetermined trigger condition, after a predetermined amount of time, etc. According to exemplary embodiments, a background health checker may traverse the entire occupied Flash space within a well-defined time interval.

Figure 6:
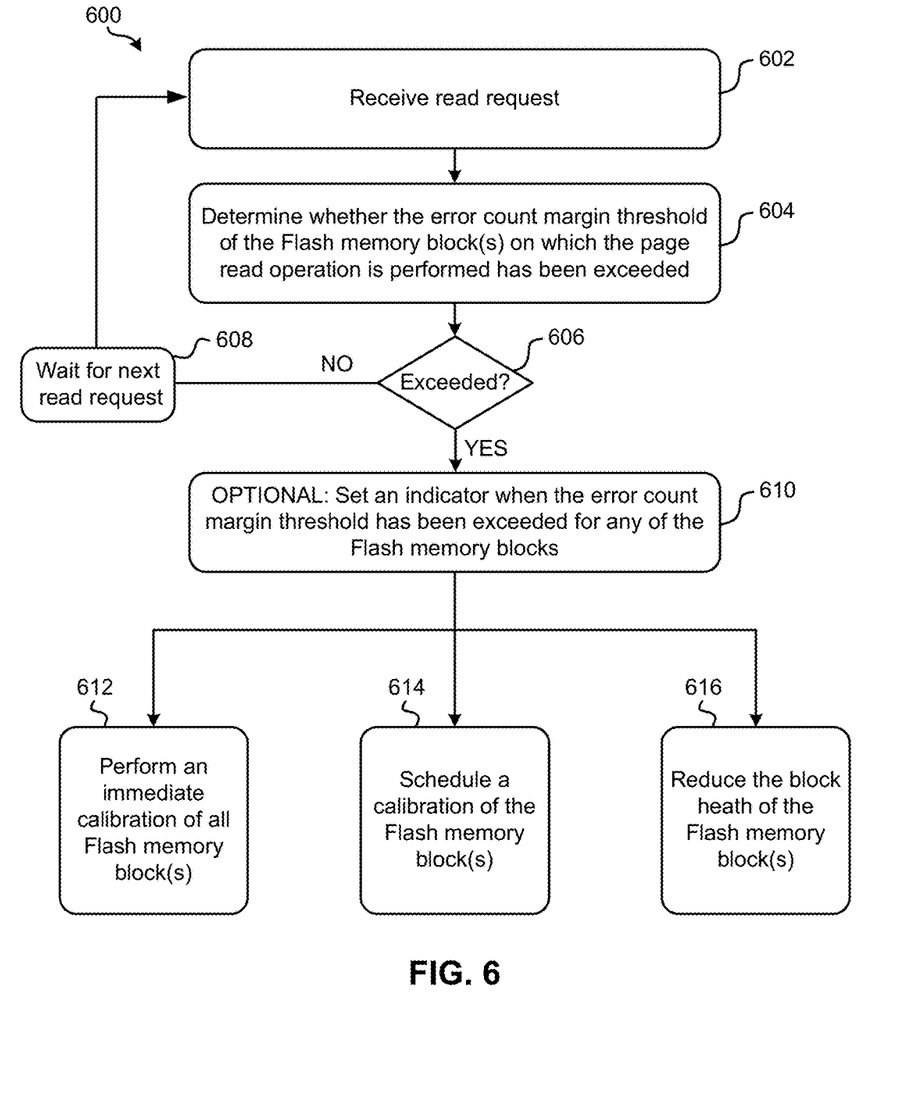
FIG. 6 is a flowchart of a method, in accordance with one embodiment.

Referring still to FIG. 5, operation 504 includes calculating an error count margin threshold for the Flash memory block individually. An error count margin threshold for a Flash memory block represents the maximum acceptable error count for that Flash memory block. In other words, if a current error count of a Flash memory block exceeds the error count margin threshold thereof, one or more actions may be taken as a result, e.g., see operations 612, 614, 616.

It should be noted that the calculated error count margin is higher than the current maximum error count of the worst codeword in any page in the block and typically lower than the block retirement error count limit at which a block will be withdrawn from use. Only towards end of life the error count margin will eventually reach the block retirement error count limit. According to some embodiments, an error count margin threshold may be calculated as being the error count equivalent to the current block health value of the corresponding Flash memory block plus a given percentage of the error count equivalent of the current block health. The percentage added to the error count margin may be from about 10% to about 50% of the current error count equivalent of the block health value, but may be higher or lower depending on various conditions (e.g., such as program time, erase value(s), etc. as would be appreciated by one skilled in the art upon reading the present description) and/or the desired embodiment.

The error count margin threshold of each Flash memory block is individually updated over time. In other words, each Flash memory block may be individually examined and updated to accurately represent a current condition thereof. Thus, different embodiments disclosed herein are able to provide increased accuracy when designating the current conditions of various Flash memory blocks. According to some embodiments, at least some of the error count margin thresholds may be calculated by firmware as would be appreciated by one skilled in the art upon reading the present description. Moreover, the embodiments disclosed herein are not required to maintain and/or monitor tables of Flash memory block indexes as seen in conventional products.

Following operation 504, the updated block health value may be stored in a memory, e.g., a memory that also includes Flash memory block parameters, for example, saved in a lookup table. See operation 506. According to some embodiments, the updated block health value may be stored in Flash controller memory 410. Read disturb counters and/or threshold voltage shift values may also be stored in Flash controller memory 410, thereby preferably reducing frequency of accesses to and/or time spent accessing Flash controller memory 410 during read operations.

Operation 508 returns the process to operation 502 for the next Flash memory block, and the operations 502-506 are repeated for each block until all relevant Flash memory blocks are processed.

Referring to FIG. 6, a method 600 according to one embodiment is performed upon receiving a read request. Method 600 starts at the arrival of a read request processed by the Flash controller 408. See operation 602. The read request may be a host read request or any internal read request such as a garbage collection relocation operation, a health check read operation, etc. Any read request to a logical page will result into one or more physical page read requests being issued by the Flash controller 408.

For each physical page read request, method 600 includes determining whether the error count margin threshold of the Flash memory block on which the page read operation is performed has been exceeded. See operation 604. As alluded to above, an error count margin threshold for a Flash memory block represents the maximum acceptable error count of any ECC codeword in the Flash page for that Flash memory block. To better understand the determination made in operation 604, brief reference is made to FIGS. 7A-7B.

Figure 7A:
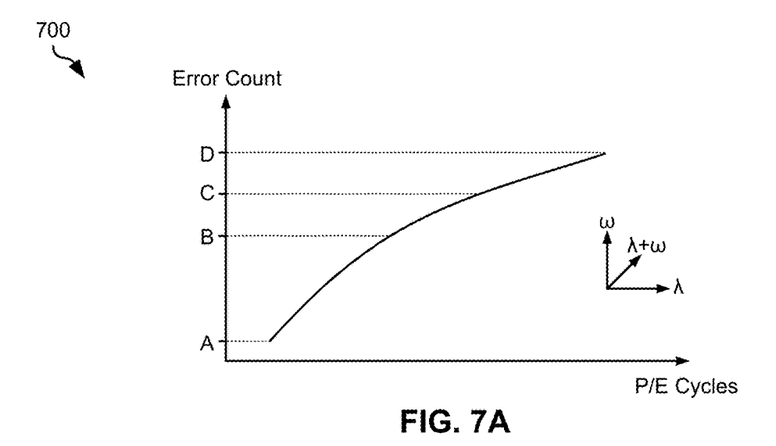
FIGS. 7A-7B are graphs showing tracking threshold voltage levels, in accordance with two embodiments.
Figure 7B:
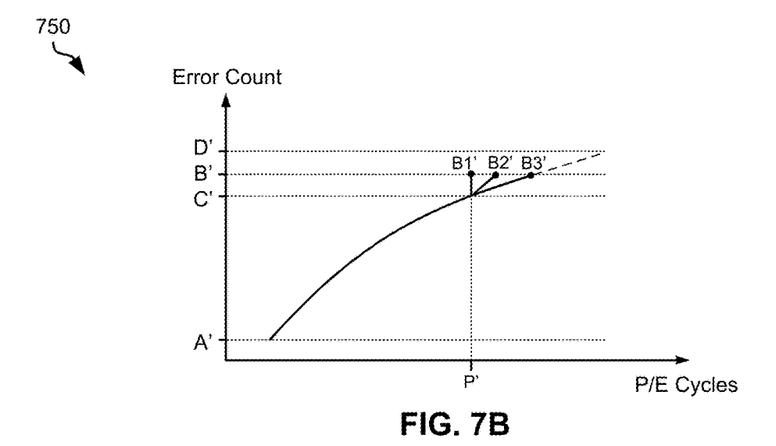

FIGS. 7A-7B show graphs 700, 750 which track threshold voltage levels, in accordance with two embodiments. As illustrated, the error count rate increases for an exemplary Flash memory block with respect to the number of P/E cycles performed on that Flash memory block (see λ). This "cycling" error contribution is a result of degradation of the physical blocks. Furthermore, as previously mentioned, the error count rate of the Flash memory block may also increase due to retention and/or read disturbances, which has also been represented on the graphs (see ω). This type of error is generally associated with degradation of the data stored on a block, but is generally non-destructive to the physical block.

Looking to the curve illustrated in graph 700, the current max error count B for the Flash memory block is greater than an initial error count rate A for the Flash memory block. The current max error count B corresponds to the number of errors of the worst ECC codeword in the block. For example, the highest number of errors associated with a single ECC codeword, which can be determined upon reading the block, is selected as the current max error count B. Again, the error count rate for a given Flash memory block tends to increase with time and use.

The current max error count B is also shown as being less than an error count margin threshold C of the present example. Thus, it is determined that the error count margin threshold C has not been exceeded by the current max error count B.

Alternatively, looking to FIG. 7B, graph 750 illustrates the error count margin threshold C' which had been calculated at a certain point in time where the P/E cycle count was equal to P' as having been exceeded by the current maximum error count B' in three different situations B1', B2', and B3'. The exceeding B1' resulted from non-destructive errors due to retention or read disturbs only (no additional P/E cycling) whereas the exceeding B3' resulted from destructive errors due to P/E cycling only. In addition, exceeding B2' resulted from both, destructive and non-destructive errors. Therefore, the embodiment illustrated in FIG. 7B may result in one or more additional actions being taken, e.g., see operations 612, 614, 616.

Although both graphs 700, 750 illustrate the error count margin threshold C, C' as less than a block retirement error count limit D, D' respectively, in alternative embodiments, an error count margin threshold may reach the corresponding block retirement error count limit. As the block health of a Flash memory block degrades as a function of cycling and data retention, the error count margin threshold associated therewith increases. In other words, the maximum allowable error count for a given Flash memory block increases to compensate for the degrading health of that block and hence has to be periodically updated by method 500 of FIG. 5.

However, as the error count margin threshold increases with use and/or time, it eventually reaches the block retirement error count limit for the Flash memory block. Embodiments in which the error count margin threshold of a Flash memory block reaches the block retirement error count limit, the Flash memory block is preferably retired. However, alternative measures may be taken, e.g., depending on the desired embodiment.

The block retirement error count limit of a given Flash memory block is typically fixed, but may vary depending on ECC schemes used, NAND flash technology, characterization data, etc. according to different embodiments.

Referring again to operation 604 of FIG. 6, the determination is preferably made during a physical read operation. According to some embodiments, operation 604 may be performed during every physical read operation performed. In such embodiments, Flash controller 408 may determine whether the error count margin threshold has been exceeded for the Flash memory block on which the read operation was executed. Note that in some embodiments logical read operations may be split into one or more physical read operations where logical read operations come from one or more hosts or, according to alternate embodiments, read operations may be performed periodically, e.g., upon receiving a request, upon experiencing a predetermined trigger condition, after a predetermined amount of time, etc. which are typically part of a background health check process executed on the GPP 412. To do so, the current error count of all codewords in the physical page read is determined and the used to compare against the error count margin threshold.

At decision 606, when it is determined that the error count margin threshold has not been exceeded for the physical page read in the Flash memory block, method 600 proceeds to operation 608 to await the next read request.

However, if it is determined that the error count margin threshold has been exceeded for the physical page read in the Flash memory block, an appropriate memory block management function is performed. The memory block management functions may include one or more actions, such as operations 612, 614, 616. Such action(s) may be performed in direct response to decision 606. Moreover, such action(s) may be performed on only those blocks for which the threshold has been exceeded, on additional blocks, or all blocks.

As an option, the method 600 may include operation 610 where triggering an appropriate memory block management function includes setting an indicator for the Flash memory block having an exceeded error count margin threshold. In some embodiments, the indicator may be a single bit, e.g., which displays logical values "1" and "0". In other embodiments, the indicator may include more than one bit capable of encoding additional information such as, but in no way limited to, the block health of the Flash memory block, the error count margin threshold of the Flash memory block, the block retirement error count limit of the Flash memory block, etc. In yet another embodiment the indicator may be implicit by directly executing or queueing one of the actions 612, 614, or 616 for the particular block. According to an illustrative embodiment, the indicator may be a designated bit which is set in the status field made available to a CPU processing read completion status operations. Moreover, the designated bit may be stored in a metadata table.

The indicators may be used, e.g., by firmware executed on the GPP 412, to denote Flash memory blocks for which additional action such as an appropriate memory block management function is desired. Operations 612, 614, 616 represent alternative actions which may be performed on a given Flash memory block per the selected memory block management function. It should be noted that a different alternative actions may be performed on different Flash memory blocks. For example, operation 612 may be performed on a first Flash memory block having a set indicator, while operation 616 may be performed on a second and third Flash memory block. Alternatively, operation 614 may be performed on a first Flash memory block having a set indicator, operation 616 may be performed on a second Flash memory block and operation 612 may be performed on a third Flash memory block. However, in other embodiments, only one of the operations 612, 614, 616 may be performed.

Referring still to FIG. 6, operation 612 includes performing an immediate calibration of all Flash memory blocks having an indicator set. Referring to the present description, "immediate calibration" is intended to mean that the Flash memory blocks having an indicator set are calibrated as soon as possible, which may vary depending on the embodiment. In some embodiments, the immediate calibrations may be performed at the first available instance of a current background health check iteration, e.g., upon completing a current task, upon dropping below a predetermined processing backlog level, at the end of the background health check iteration, etc. In other embodiments, the immediate calibrations may be performed when the Flash memory blocks are written with new data, e.g., if the Flash memory blocks are currently erased. In yet other embodiments, a current task of a background health check iteration may be stopped, e.g., regardless of its status, such that the immediate calibrations may be performed.

Operation 614 presents an additional action which includes scheduling a calibration of the Flash memory blocks having the indicator set. Although it is preferred that the scheduled calibration is performed during a subsequent background health check, in other embodiments, the scheduled calibration may be performed after a number of background health check iterations have occurred, after a predetermined amount of time, etc., as background health check iterations may, in some instances, not perform calibrations of Flash memory blocks. Unless directed, a background health check iteration may simply perform a read sweep on Flash. Further still, in some embodiments a scheduled calibration of Flash memory blocks having set indicators may be performed during a currently ongoing background health check iteration.

In other embodiments, calibration may be performed on Flash memory blocks based on a priority level associated therewith. For example, Flash memory blocks having a higher priority level may be calibrated first, while Flash memory blocks having a lower priority level may be calibrated thereafter. According to another example, Flash memory blocks having a higher priority level may be calibrated immediately, e.g., regardless of a current background health check iteration task, while Flash memory blocks having a lower priority level may be calibrated at a later time, e.g., upon completing a task list, upon dropping below a predetermined processing backlog level, at the end of the background health check iteration, etc.

Once a Flash memory block has been calibrated, the previously calculated error count margin threshold for that Flash memory block may no longer be accurate. Thus, after the calibration of one or more Flash memory blocks has been completed, a new error count margin threshold is preferably calculated at least for the calibrated one or more Flash memory blocks. In one embodiment, upon completing the calibration one or more Flash memory blocks, a background health check may be performed to calculate an updated error count margin threshold for at least the newly calibrated Flash memory blocks. However, in other embodiments, a background health check may be performed on each Flash memory block immediately following its calibration to obtain an updated error count margin threshold.

Operation 616 presents yet another available action which includes reducing the block health of the Flash memory blocks having the indicator set, e.g., such that they will be used to store colder data. As previously mentioned, various embodiments described herein may perform heat segregation of data whereby hot data is frequently updated, while colder data is updated less frequently. It follows that, by reducing the strain on Flash memory blocks having lower block health, their expected life span (the amount of time before the error count margin threshold reaches the block retirement error count limit) may be extended.

Upon performing any one or more of operations 612, 614, 616, method 600 may optionally return to operation 602 whereby subsequent operations illustrated in FIG. 6 may be performed. However, in other embodiments, additional operations may be performed, e.g., such as a write operation, reallocation, etc., before one or more of the operations of method 600 are performed.

It should be mentioned that in other embodiments, a system may have a controller and logic integrated with and/or executable by the controller to perform any one or more of the operations described above with reference to method 500 and 600 of FIG. 5 and FIG. 6. In one embodiment, the system may further include an apparatus (such as a storage controller) which has the controller coupled thereto.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

In addition, although embodiments have been described that include use of a NAND flash memory, it should be appreciated that the inventions herein are not limited to use with NAND flash memory, but are instead applicable to any other non-volatile random access memory (NVRAM) technology. For example, the disclosed techniques may be applied to phase-change memory (PCM), magnetoresistive RAM (MRAM) and resistive RAM (RRAM).

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
   a plurality of non-volatile memory blocks configured to store data; and
   a controller and logic integrated with and/or executable by the controller, the logic being configured to:
      calculate an error count margin threshold for each of at least some of the non-volatile memory blocks;
      determine whether the error count margin threshold of any of the at least some of the non-volatile memory blocks has been exceeded; and
      trigger a memory block management function upon determining that the error count margin threshold of any of the at least some of the non-volatile memory blocks has been exceeded,
      wherein the calculating and the determining for each of the at least some of the non-volatile memory blocks improves performance of the system by preventing any of the at least some of the non-volatile memory blocks from being skipped over during the calculating and the determining.

2. The system as recited in claim 1, wherein the memory block management function includes setting an indicator.

3. The system as recited in claim 1, wherein the memory block management function includes performing an immediate calibration of at least the non-volatile memory blocks having the exceeded error count margin threshold.

4. The system as recited in claim 1, wherein the memory block management function includes scheduling a calibration of at least the non-volatile memory blocks having the exceeded error count margin threshold, wherein the calibration is scheduled to be performed during a subsequent background health check.

5. The system as recited in claim 1, wherein the memory block management function includes scheduling a calibration of at least the non-volatile memory blocks having the exceeded error count margin threshold, wherein the calibration is performed during a currently ongoing background health check iteration.

6. The system as recited in claim 1, wherein the logic is configured to:
   reduce a block health of the non-volatile memory blocks having the exceeded error count margin threshold, thereby extending a life span of the plurality of non-volatile memory blocks.

7. The system as recited in claim 1, wherein a non-volatile memory block is retired when the error count margin threshold of the non-volatile memory block reaches a block retirement error count limit.

8. The system as recited in claim 1, wherein the non-volatile memory is a NAND Flash memory, wherein the error count margin threshold of each non-volatile memory block is individually updated over time, with a proviso that Flash memory block index tables are not maintained and/or monitored.

9. The system as recited in claim 1, the logic being configured to:
  determine a block health of each of the at least some of the non-volatile memory blocks,
  wherein the block health of each of the at least some of the non-volatile memory blocks corresponds to a highest number of errors associated with a single error correction code codeword in the respective block.

10. A method, comprising:
  calculating an individual error count margin threshold for each of more than one non-volatile memory blocks of a plurality of non-volatile memory blocks;
  for each of the more than one non-volatile memory blocks, determining whether the respective error count margin threshold has been exceeded; and
  triggering a memory block management function upon determining that the error count margin threshold of any of the more than one non-volatile memory blocks has been exceeded,
  wherein the calculating and the determining for each of the more than one non-volatile memory blocks improves performance of the plurality of non-volatile memory blocks by preventing any of the more than one non-volatile memory blocks from being skipped over during the calculating and the determining.

11. The method as recited in claim 10, wherein the memory block management function includes setting an indicator.

12. The method as recited in claim 10, wherein the memory block management function includes performing an immediate calibration of at least the non-volatile memory blocks having the exceeded error count margin threshold.

13. The method as recited in claim 10, wherein the memory block management function includes scheduling a calibration of at least the non-volatile memory blocks having the exceeded error count margin threshold, wherein the calibration is scheduled to be performed during a subsequent background health check.

14. The method as recited in claim 10, wherein the memory block management function includes scheduling a calibration of at least the non-volatile memory blocks having the exceeded error count margin threshold, wherein the calibration is performed during a currently ongoing background health check iteration.

15. The method as recited in claim 10, comprising:
  reducing a block health of the non-volatile memory blocks having the exceeded error count margin threshold, thereby extending a life span of the plurality of non-volatile memory blocks.

16. The method as recited in claim 10, wherein a non-volatile memory block is retired when the error count margin threshold of the non-volatile memory block reaches a block retirement error count limit.

17. The method as recited in claim 10, wherein the error count margin threshold of each non-volatile memory block is individually updated over time.

18. The method as recited in claim 10, wherein the non-volatile memory is a NAND Flash memory in a storage apparatus, wherein the memory block management function includes scheduling a calibration of at least the non-volatile memory blocks having the exceeded error count margin threshold, wherein the calibration is based on a priority level associated with each of the respective non-volatile memory blocks having the exceeded error count margin threshold, wherein the calculating and the determining is performed for every non-volatile memory block in the storage apparatus.

19. A computer program product comprising a computer readable storage medium having program instructions embodied therewith, the program instructions readable and/or executable by a controller to cause the controller to:
  calculate, by the controller, an error count margin threshold for each of at least some non-volatile memory blocks of a plurality of the non-volatile memory blocks;
  determine, by the controller, whether the error count margin threshold of any of the at least some of the non-volatile memory blocks has been exceeded; and
  trigger, by the controller, a memory block management function upon determining that the error count margin threshold of any of the at least some of the non-volatile memory blocks has been exceeded,
  wherein the memory block management function includes setting an indicator,
  wherein the calculating and the determining for each of the at least some of the non-volatile memory blocks improves performance of the plurality of non-volatile memory blocks by preventing any of the at least some of the non-volatile memory blocks from being skipped over during the calculating and the determining.

20. The computer program product as recited in claim 19, wherein the error count margin threshold of each of the at least some non-volatile memory blocks is individually updated over time.

* * * * *